(12) United States Patent
Haran et al.

(10) Patent No.: US 10,007,743 B2
(45) Date of Patent: Jun. 26, 2018

(54) MODEL-BASED ECHO CURVE PREDICTION FOR PULSED RADAR

(71) Applicant: Honeywell International Inc., Morristown, NJ (US)

(72) Inventors: Frank Martin Haran, North Vancouver (CA); Stephane Savard, Vancouver (CA)

(*) Notice: Subject to any disclaimer, the term of this patent is extended or adjusted under 35 U.S.C. 154(b) by 261 days.

(21) Appl. No.: 14/859,658

(22) Filed: Sep. 21, 2015

(65) Prior Publication Data

US 2016/0098500 A1 Apr. 7, 2016

Related U.S. Application Data

(60) Provisional application No. 62/058,327, filed on Oct. 1, 2014.

(51) Int. Cl.
| | |
|---|---|
| *G06F 17/16* | (2006.01) |
| *G06F 17/50* | (2006.01) |
| *G01F 23/284* | (2006.01) |
| *G01S 13/88* | (2006.01) |
| *G01S 7/40* | (2006.01) |
| *G01S 13/10* | (2006.01) |

(52) U.S. Cl.
CPC ........ *G06F 17/5009* (2013.01); *G01F 23/284* (2013.01); *G01S 7/40* (2013.01); *G01S 13/88* (2013.01); *G06F 17/16* (2013.01); *G01S 13/10* (2013.01)

(58) Field of Classification Search
CPC ........ G06F 17/5009; G06F 17/16; G01S 7/40; G01S 13/88; G01S 13/10; G01F 23/284

USPC ......................................................... 342/124
See application file for complete search history.

(56) References Cited

U.S. PATENT DOCUMENTS

| | | | | |
|---|---|---|---|---|
| 6,879,282 | B2* | 4/2005 | Haynes | G01F 23/284 |
| | | | | 342/124 |
| 8,353,209 | B1* | 1/2013 | Zimmerli | G01F 22/00 |
| | | | | 73/290 B |
| 2006/0137446 | A1* | 6/2006 | Wennerberg | G01F 23/284 |
| | | | | 73/290 V |
| 2009/0299662 | A1 | 12/2009 | Fehrenbach et al. | |
| 2010/0017174 | A1* | 1/2010 | Lyon | G01F 23/284 |
| | | | | 703/2 |

(Continued)

FOREIGN PATENT DOCUMENTS

| | | |
|---|---|---|
| EP | 2148218 A1 | 1/2010 |
| WO | 2015112387 A1 | 7/2015 |

*Primary Examiner* — Timothy A Brainard
(74) *Attorney, Agent, or Firm* — Jetter & Associates, P.A.

(57) ABSTRACT

A method of modeling a pulsed radar gauge (PRG) that includes a transceiver coupled by a process connection to a probe installed on a tank having at least one product material therein. A mathematical model is provided that includes (i) dielectric properties and dimensions of materials used in the process connection, (ii) at least one tank dimension, (iii) dielectric characteristics of the product material, and (iv) a probe length. Using a processor implementing a stored echo prediction algorithm that utilizes the mathematical model inputting pulse characteristics including a shape of an input radar pulse launched by a transmitter of the transceiver onto the probe into the mathematical model, and generating a predicted echo curve from the mathematical model.

9 Claims, 2 Drawing Sheets

(56) References Cited

U.S. PATENT DOCUMENTS

| | | | | |
|---|---|---|---|---|
| 2013/0118251 A1* | 5/2013 | Welle | ................... | G01F 22/00 |
| | | | | 73/290 R |
| 2014/0085133 A1* | 3/2014 | Flasza | ................... | G01S 13/88 |
| | | | | 342/124 |
| 2015/0204712 A1* | 7/2015 | Krolak | ............... | G01F 25/0061 |
| | | | | 702/94 |

* cited by examiner

MODEL-BASED ECHO CURVE PREDICTION FOR PULSED RADAR

CROSS REFERENCE TO RELATED APPLICATIONS

This application claims the benefit of Provisional Application Ser. No. 62/058,327 entitled "MODEL-BASED ECHO CURVE PREDICTION FOR PULSED RADAR", filed Oct. 1, 2014, which is herein incorporated by reference in its entirety.

FIELD

Disclosed embodiments relate to prediction of echo curves generated by pulsed radar level gauges.

BACKGROUND

Industrial plants having containers or tanks ("tanks") generally need to regularly measure the level of liquid(s) or other materials therein such as powders. There are several types of systems and techniques used for level measurement, which generally utilize time domain reflectometry (TDR) which relies on analyzing echoes.

For TDR-based measurements, there are contact level measurements, where a part of the system, such as a probe, contacts the material being measured, and non-contact level measurements where the level is measured with a probe without contacting the material to be measured. Non-contact methods include ultrasound which uses high-frequency sonic (sound) waves to detect the level, and radar which uses electromagnetic energy at radio frequencies which propagate through free space.

Guided wave radar (GWR) is a particular contact pulsed radar method used to measure the level of liquids or solids in a tank. GWR works by generating a stream of pulses of electromagnetic energy and propagating the pulses down a transmission line formed into a level sensing probe. The probe is generally placed vertically in a tank or other container and the electromagnetic pulse is launched downward from the top of the probe. The probe is open to both the air and the material(s) to be sensed in such a way that the electromagnetic fields of the propagating pulse penetrate the air (or other gas, liquid or perhaps a solid) until they reach the level of the product material. At that point, the electromagnetic fields see the higher dielectric constant of the product material. This higher dielectric constant causes a reduction in the impedance of the transmission line, resulting in a pulse echo being reflected back to the top of the probe. The pulse travels through the generally air dielectric portion of the probe above the product material at a known velocity. Knowing both the return trip time of the radar pulse and the dielectric constant of the material through which the radar pulse propagates allows the material level(s) on the probe to be determined.

When installing a pulsed radar level gauge on a tank for the first time or when troubleshooting an existing pulsed radar level gauge installation, software-based set-up tools are typically used as a setup aid. These set-up tools are used to program the pulsed radar level gauge with such parameters as waveguide length, tank nozzle dimensions (for tanks having nozzles), product material(s) in the tank (their dielectric constants), and expected tank disturbances (e.g., foam, turbulence). In addition to setting up the pulsed radar level gauge and application parameters, the set-up tool is generally also used to collect and display actual echo curves received responsive to transmitted radar pulses. Such displayed actual echo curves are then used by the operator (e.g., technician or engineer) to judge whether the pulsed radar level gauge has been set-up and is operating as expected, and this judgment is dependent upon the experience and expertise of the pulsed radar level gauge operator.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize when a pulsed radar level gauge (PRG) operator (e.g., technician or engineer) lacks sufficient experience or expertize in analyzing echo curves to judge whether the PRG has been set-up correctly, there is a risk that the operator can make the wrong judgment whether the PRG has been installed or is functioning correctly. Disclosed embodiments utilize a PRG's construction including at least one parameter for the process connection, at least one tank dimension, dielectric characteristics of the tank's product material contents, and a length of the probe in a mathematical model which predicts the shape and features of the expected echo curve (echo prediction software) for a given input radar pulse. The input radar pulse is launched by a transmitter (generally part of a transceiver) via the process connection onto the probe as an input for the mathematical model.

A disclosed echo prediction algorithm (software) runs the mathematical model and compares the predicted echo curve to an actual echo curve obtained by the PRG which can also be displayed together (overlaid) on a suitable display device for an operator. In one embodiment an alarm can be automatically generated when the actual echo curve varies from the predicted echo curve by more than a predetermined amount.

DETAILED DESCRIPTION

Figure 1:
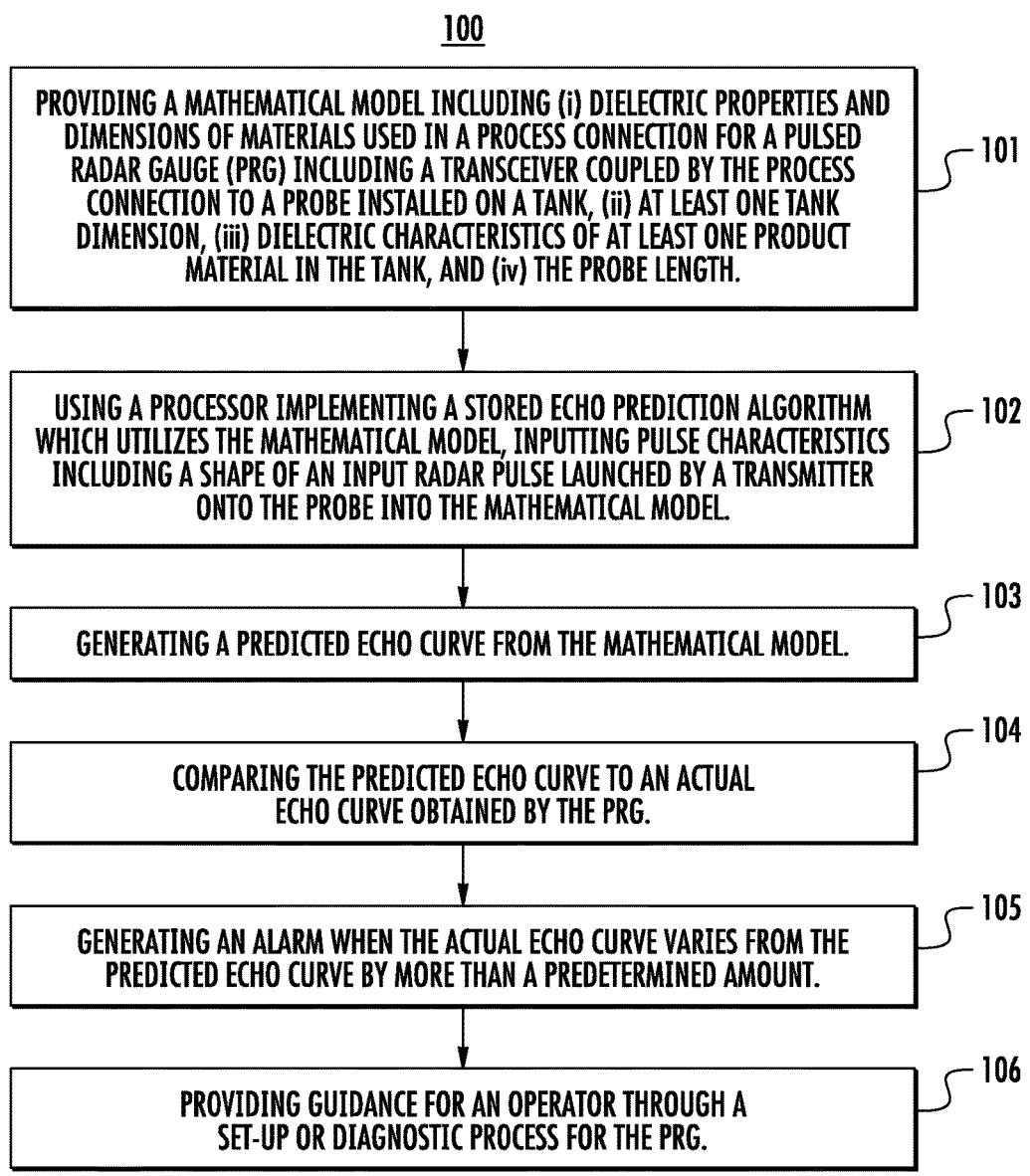
FIG. 1 is a flow chart that shows steps in an example method of predicting pulse echo curves generated by a computing device implementing an echo prediction algorithm for a PRG that includes a transceiver coupled by a process connection to a probe installed on a tank having at least one product material therein, according to an example embodiment.

Disclosed embodiments are described with reference to the attached figures, wherein like reference numerals are used throughout the figures to designate similar or equivalent elements. The figures are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring certain aspects. This Disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Disclosed embodiments include echo prediction algorithms for setting up or troubleshooting PRGs that utilizes (i) at least one parameter for the process connection, (ii) at least one tank dimension, (iii) the dielectric characteristics of the product material(s) in the tank, and (iv) the probe length, in a mathematical model. For a given input radar pulse launched by a transmitter onto the probe used as a model input, the echo prediction algorithm predicts the shape and features of the expected echo curve and generates a predicted echo curve. The predicted echo curve can be generated by the PRG itself or by a set-up software tool which runs on a separate computing device such as a handheld device, laptop computer, tablet, etc. which is communicably coupled (e.g., by a wire, cable or wireless connection) to the PRG.

The predicted echo curve can be overlaid with an actual echo curve obtained by the PRG on a display of the PRG, or at the separate computing device when a separate computing device is utilized to generate the predicted echo curve, or at another display device (e.g., in a control room of the plant) coupled to receive the predicted echo curve and actual echo curve). Tank operators viewing the overlay can easily compare the predicted echo curve against the real (actual) echo curve captured by the PRG.

If the real echo curve displayed together with the predicted echo curve differs significantly (e.g., by a predetermined amount) from the predicted echo curve then the echo prediction algorithm or the operator can make a judgment the PRG has not been installed properly and/or is functioning improperly. In addition to being used to provide a visual aid to the operator, disclosed echo prediction algorithms can also compare the predicted echo curves to the real (actual) echo curves to produce alarms or provide guidance to the operator through the set-up or diagnostic process for the pulsed radar gauge to reduce the "error" between the real echo curve and the predicted echo curve. Parameters or items that can be compared by disclosed echo prediction algorithms include the amplitude, position, width or number of the reflection peaks resulting from echo curve influences such as the process connection, product material level in the tank, or the end of probe, and also the general shape of the echo curve.

From either measurement or design it is recognized one can obtain the characteristics of the radar pulse launched onto the probe (or waveguide) of the PRG. As described above, given the PRG's construction including (i) dielectric properties and dimensions of the materials used in the process connection, (ii) at least one tank dimension, (iii) the dielectric characteristics of the product material(s) in the tank, and (iv) the probe length, an ABCD matrix transformation can be used as a mathematical model which reflects these parameters to predict how the input (transmitted) radar pulse is transformed into the reflected echo curve.

The ABCD matrix for a multi-interface system shown below including parameters $m_{11}$, $m_{12}$, $m_{21}$, $m_{22}$ relates an output (echo curve) waveform having x and y axis components say $E^o_x$, $E^o_y$ (E being the electric field), and the M's being parameters based on the refractive index and thickness of respective materials or mediums and their interfaces in the tank that the electric field is propagating through to an input (transmitted) pulse waveform having components $E^i_x$, $E^i_y$:

$$\begin{bmatrix} E^o_x \\ E^o_y \end{bmatrix} = \begin{bmatrix} m_{11} & m_{12} \\ m_{21} & m_{22} \end{bmatrix} \times \begin{bmatrix} E^i_x \\ E^i_y \end{bmatrix}, \text{where}$$

$$M = M_i M_{i+1} M_{i+2} \ldots = \begin{bmatrix} m_{11} & m_{12} \\ m_{21} & m_{22} \end{bmatrix}$$

The ABCD matrix may also be referred to as a transmission matrix, or transmission parameters of a two port network. For example, a 2 interface system in a tank may comprise air over oil over water so that in that case $M_i = M_{air}$ having refractive index $n_{air}$, $M_{i+1} = M_{oil}$ having $n_{oil}$ and $M_{i+2} = M_{water}$ having $n_{water}$. An example ABCD matrix approach applied to predict an output for an optical system given an optical input and an optical network is also described in a textbook Optics, Eugene Hecht, second edition, Addison-Wesley Publishing Company. Inc. 1987, p. 373-378. Besides the ABCD model, other mathematical models may be used with disclosed embodiments. For example, approximated Fresnel equations may be used in the time domain.

The process connection (e.g., coaxial connector and feedthrough) can be designed (and thus known), and the customer generally knows their tank's dimensions such as the height, diameter, the product material kept in the tank (e.g. oil, water, sand, wood chips, acid). Also generally known is the position of the PRG within the tank and any obstacles (e.g., ladders, inlets, outlets, impellors) in the tank close to the probe, and the product material contents in the tank. Also generally known or can be found is all dielectric and dimensional characteristics except the tank's level and when an interface is present, the interface thickness, and interface location.

FIG. 1 is a flow chart that shows steps in an example method 100 of modeling predicted pulse echo curves generated by a PRG including a transceiver coupled by a process connection to a probe installed on a tank having at least one product material therein, according to an example embodiment. Step 101 comprises providing a mathematical model including (i) the dielectric properties and dimensions of the materials used in the process connection (e.g., coaxial connector to a feedthrough, (ii) at least one tank dimension (e.g., height of the tank, and nozzle dimensions if applicable), (iii) dielectric characteristics of the product material in the tank, and (iv) the probe length. As noted above, the model utilized can comprise an ABCD matrix.

Step 102 comprises using a processor implementing stored echo prediction software which utilizes the mathematical model, inputting pulse characteristics including a shape of an input radar pulse launched by the transmitter onto the probe as an input for the mathematical model (model input). Step 103 comprises generating a predicted echo curve from the mathematical model.

Step 104-106 are optional steps that can be provided by disclosed echo prediction software. Step 104 comprise comparing the predicted echo curve to an actual echo curve obtained by the PRG. As noted above, the predicted echo curve may also be overlaid with the actual echo curve obtained by the PRG on a display device for an operator.

Step 105 comprises generating an alarm when the actual echo curve varies from the predicted echo curve by more than a predetermined amount. Step 106 comprises after the alarm providing guidance for an operator through a set-up or a diagnostic process for the PRG. As described above, parameters or items that can be compared include the amplitude, position, width or number of the reflection peaks resulting from echo curve influences such as the process connection, level, or the end of probe, and also the general shape of the echo curve.

The guidance for an operator can be provided through a set-up or diagnostic process for implementing change(s) to improve the performance of the PRG. For example, if the level peak was not present but the process connection feature was present, the guidance can suggest checking for something wrong with the process connection to the waveguide. If the amplitude of the refection from the level was lower or broader the guidance can suggest checking whether foam or turbulence is present. If there was an unpredicted peak present on the echo curve the guidance can suggest checking whether there is build-up of material (e.g., crude oil) on the probe or an unexpected interference from an obstacle in the tank.

In the case of two or more product materials being in the tank, the customer can sometimes estimate or range bound the level and interface thickness or a secondary measure such as differential pressure may be available for use to provide an estimate of the level and interface thickness. From this information and a model such as based on ABCD matrix modelling or other suitable model, a prediction of the echo curve can then be displayed and or processed to ensure the PRG has been installed correctly and is functioning as expected.

Figure 2:
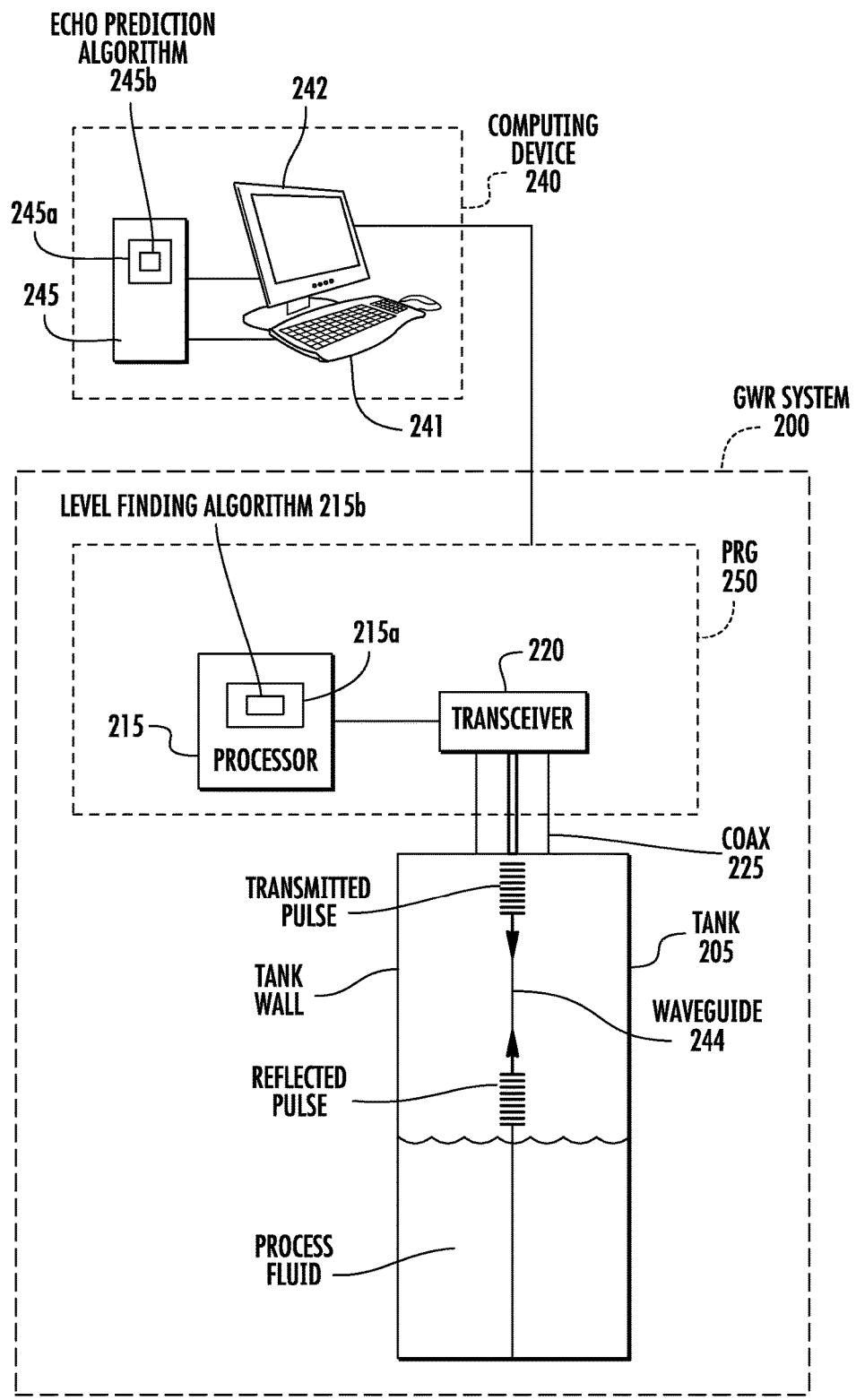
FIG. 2 depicts an example guided wave radar (GWR) system including a PRG and a separate computing device communicably coupled thereto that has a processor which runs a stored disclosed echo prediction algorithm for providing a method of predicting pulse echo curves generated by the PRG, according to an example embodiment.

As noted above, instead of the PRG including a disclosed echo prediction algorithm, an installer can hook up a separate computing device that runs troubleshooting software including a disclosed echo prediction algorithm. FIG. 2 depicts an example GWR system 200 that includes a PRG 250, and a separate computing device 240 including a disclosed echo prediction algorithm 245b shown implemented in software stored in an integral (on-chip) memory (e.g., flash memory) 245a associated with its processor 245 that runs the echo prediction algorithm 245b for providing a method of predicting pulse echo curves generated by the PRG 250, according to an example embodiment. Computing device 240 can comprise a handheld device, a tablet, a laptop computer or a personal computer (PC). The computing device 240 as shown includes a keyboard 241 and a display 242.

The PRG 250 is shown including its own processor 215 and an integral (on-chip) memory 215a (e.g., flash memory) that stores a level finding algorithm 215b. Other (external) memory that can hold some constants and other data used by the level finding algorithm 215b. Computing device 240 is communicably coupled to the PRG 250 by a wire, cable or a wireless connection. This arrangement shown having the echo prediction algorithm 245b being separate from the PRG 250 reflects a typical arrangement because the PRG 250 may not have sufficient processing power to perform the needed calculations and/or provide the necessary graphical user interface (GUI) to allow a tank installer to troubleshoot the system.

Display 242 can be used to display the predicted echo curve together with the actual echo curve obtained by the PRG 250. Computing device 240 can also generate an alarm (visual such as a blinking light, or an audio alarm) when the actual echo curve varies from the predicted echo curve by more than a predetermined amount, and provide guidance for an operator through a set-up and diagnostic process for the PRG 250.

The PRG 250 is also shown including a transceiver 220 providing a transmitter and a receiver that by the coaxial connector 225 couples to the top of the tank 205. The transmitter and the receiver provided by transceiver 220 may be implemented as separate blocks. Accordingly, a "transceiver" as used herein includes both of these arrangements. A flange (not shown) may also be present at the top of the tank 205. The tank 205 may also include a nozzle. The probe (or waveguide) is shown as 244. As noted above, although generally described for GWR applications, disclosed level finding can also be applied to ultrasound and non-contacting radar.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure, such as applying disclosed embodiments to ultrasound level sensing systems. In addition, while a particular feature may have been disclosed with respect to only one of several implementations, such feature may be combined with one or more other features of the other implementations as may be desired and advantageous for any given or particular application.

The invention claimed is:

1. A method of modeling a pulsed radar gauge (PRG) including a transceiver coupled by a process connection to a probe installed on a tank, comprising:
   providing a mathematical model that includes (i) dielectric properties and dimensions of materials used in said process connection, (ii) at least one dimension of said tank (tank dimension), (iii) dielectric characteristics of at least one product material in said tank, and (iv) a length of said probe (probe length);
   using a processor implementing a stored echo prediction algorithm which utilizes said mathematical model, inputting pulse characteristics including a shape of an input radar pulse launched by a transmitter of said transceiver onto said probe into said mathematical model;
   generating a predicted echo curve from said mathematical model;
   comparing said predicted echo curve to an actual echo curve obtained by said PRG, wherein said comparing compares at least one of an amplitude, position, width or number of reflection peaks, and a general shape;
   generating an alarm when said actual echo curve varies from said predicted echo curve by more than a predetermined amount, and
   after said alarm, providing guidance for an operator through a set-up or a diagnostic process for said PRG.

2. The method of claim 1, wherein said processor is part of a computing device separate from said PRG.

3. The method of claim 1, wherein said pulse characteristics are obtained from actual measurements.

4. The method of claim 1, wherein said pulse characteristics are obtained from a simulation.

5. The method of claim 1, wherein said mathematical model comprises an ABCD matrix.

6. The method of claim 1, wherein said PRG comprises a guided wave radar (GWR) level gauge.

7. A computing device, comprising:

a processor having associated memory storing an echo prediction algorithm for predicting pulse echo curves generated by a pulsed radar gauge (PRG) including a transceiver coupled by a process connection to a probe installed on a tank having at least one product material therein;

said echo prediction algorithm including mathematical model having (i) dielectric properties and dimensions of materials used in said process connection, (ii) at least one dimension of said tank (tank dimension), (iii) dielectric characteristics of said product material, and (iv) a length of said probe (probe length);

said echo prediction algorithm when implemented by said processor executing a method of predicting a pulse echo curve (predicted echo curve) generated by said PRG, said method including:

inputting pulse characteristics including a shape of an input radar pulse launched by a transmitter of said transceiver onto said probe into said mathematical model, and generating said predicted echo curve using said mathematical model comparing said predicted echo curve to an actual echo curve obtained by said PRG, wherein said comparing compares at least one of an amplitude, position, width or number of reflection peaks, and a general shape;

generating an alarm when said actual echo curve varies from said predicted echo curve by more than a predetermined amount, and after said alarm, providing guidance for an operator through a set-up or a diagnostic process for said PRG.

8. The computing device of claim 7, wherein said mathematical model comprises an ABCD matrix to generate said predicted echo curve.

9. The computing device of claim 7, wherein said computing device comprises a handheld computing device, tablet, or a laptop computer.

* * * * *